United States Patent
Wang et al.

(10) Patent No.: US 11,251,276 B2
(45) Date of Patent: Feb. 15, 2022

(54) LDMOS TRANSISTOR AND METHOD FOR MANUFACTURING THE SAME

(71) Applicant: Silergy Semiconductor Technology (Hangzhou) LTD, Hangzhou (CN)

(72) Inventors: Meng Wang, Hangzhou (CN); Hui Yu, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/415,001

(22) Filed: May 17, 2019

(65) Prior Publication Data

US 2019/0371896 A1    Dec. 5, 2019

(30) Foreign Application Priority Data

May 29, 2018 (CN) .......................... 201810531384.8

(51) Int. Cl.
| | |
|---|---|
| *H01L 29/40* | (2006.01) |
| *H01L 21/762* | (2006.01) |
| *H01L 29/10* | (2006.01) |
| *H01L 29/66* | (2006.01) |
| *H01L 29/78* | (2006.01) |

(52) U.S. Cl.
CPC ...... *H01L 29/408* (2013.01); *H01L 21/76202* (2013.01); *H01L 29/1095* (2013.01); *H01L 29/66681* (2013.01); *H01L 29/7816* (2013.01)

(58) Field of Classification Search
CPC ............. H01L 29/408; H01L 21/76202; H01L 29/1095; H01L 29/66681; H01L 29/7816; H01L 29/42368; H01L 29/0878; H01L 29/4232
See application file for complete search history.

(56) References Cited

U.S. PATENT DOCUMENTS

| | | | |
|---|---|---|---|
| 7,018,899 | B2 | 3/2006 | Sung |
| 7,074,659 | B2 | 7/2006 | Zuniga et al. |
| 7,230,302 | B2 | 6/2007 | Lotfi et al. |
| 7,888,222 | B2 | 2/2011 | You et al. |
| 7,981,739 | B1 | 7/2011 | You et al. |
| 7,999,318 | B2 | 8/2011 | Zuniga et al. |
| 8,063,444 | B2 | 11/2011 | Chang |
| 8,119,507 | B2 | 2/2012 | You |
| 8,293,612 | B2 | 10/2012 | Lee |
| 8,319,283 | B2 | 11/2012 | Min et al. |
| 8,431,450 | B1 | 4/2013 | Zuniga et al. |
| 8,455,340 | B2 | 6/2013 | Zuniga et al. |
| 8,574,973 | B1 | 11/2013 | You et al. |
| 8,581,344 | B2 | 11/2013 | Liu |
| 8,716,790 | B2 | 5/2014 | Lotfi et al. |
| 8,716,795 | B2 | 5/2014 | You |
| 8,912,600 | B2 | 12/2014 | You |
| 2010/0052052 | A1 | 3/2010 | Lotfi et al. |

(Continued)

*Primary Examiner* — Edward Chin

(57) ABSTRACT

An LDMOS transistor can include: a field oxide layer structure adjacent to a drain region; and at least one drain oxide layer structure adjacent to the field oxide layer structure along a lateral direction, where a thickness of the drain oxide layer structure is less than a thickness of the field oxide layer, and at least one of a length of the field oxide layer structure and a length of the drain oxide layer structure is adjusted to improve a breakdown voltage performance of the LDMOS transistor.

15 Claims, 13 Drawing Sheets

(56) References Cited

U.S. PATENT DOCUMENTS

2010/0102388 A1* 4/2010 Levin ............ H01L 21/823418
257/343
2014/0320174 A1 10/2014 Lu et al.
2015/0380398 A1* 12/2015 Mallikarjunaswamy ....................
H01L 29/0878
257/272

* cited by examiner

LDMOS TRANSISTOR AND METHOD FOR MANUFACTURING THE SAME

RELATED APPLICATIONS

This application claims the benefit of Chinese Patent Application No. 201810531384.8, filed on May 29, 2018, which is incorporated herein by reference in its entirety.

FIELD OF THE INVENTION

The present invention generally relates to semiconductor devices, and more particularly to laterally diffused metal oxide semiconductor devices and associated methods.

BACKGROUND

Voltage regulators, such as DC-to-DC voltage converters, are used to provide stable voltage sources for various electronic systems. Efficient DC-to-DC converters are particularly useful for battery management in low power devices (e.g., laptop notebooks, cellular phones, etc.). A switching voltage regulator can generate an output voltage by converting an input DC voltage into a high frequency voltage, and then filtering the high frequency input voltage to generate the output DC voltage. For example, the switching regulator can include a switch for alternately coupling and decoupling an input DC voltage source (e.g., a battery) to a load (e.g., an integrated circuit [IC], a light-emitting diode [LED], etc.). An output filter, can include an inductor and a capacitor, and may be coupled between the input voltage source and the load to filter the output of the switch, and thus provide the output DC voltage. A controller (e.g., a pulse-width modulator, a pulse frequency modulator, etc.) can control the switch to maintain a substantially constant output DC voltage. Lateral double-diffused metal oxide semiconductor (LDMOS) transistors may be utilized in switching regulators due to their performance in terms of a tradeoff between their specific on-resistance ($R_{dson}$) and drain-to-source breakdown voltage ($BV_{d\_s}$).

DETAILED DESCRIPTION

Figure 1:
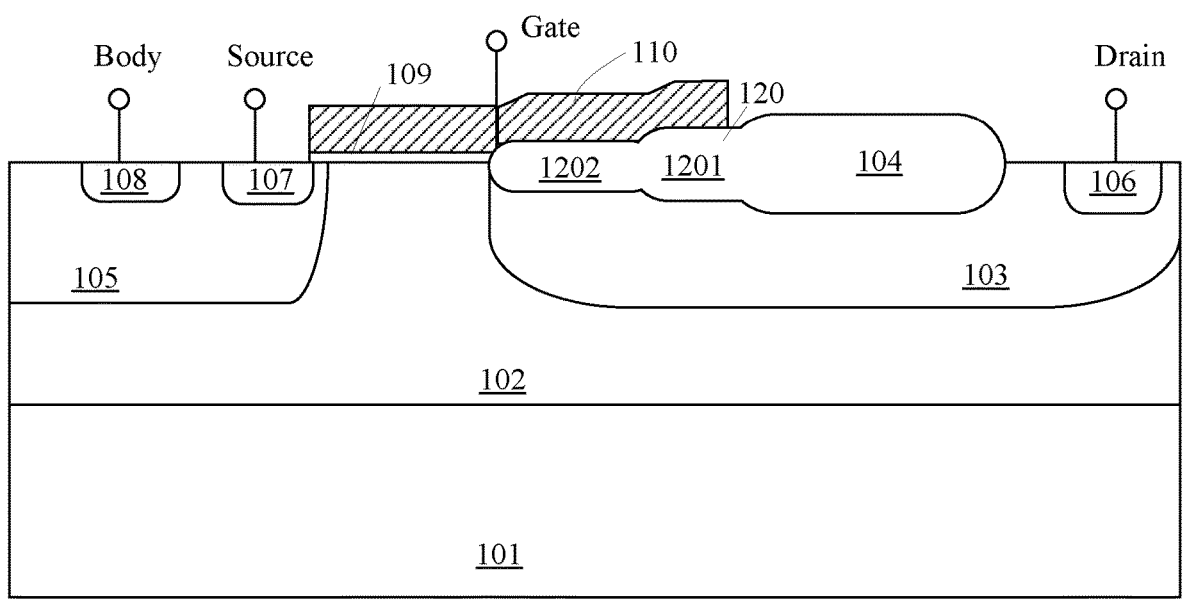
FIG. 1 is a cross-sectional view of a first example LDMOS transistor, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

In one embodiment, a laterally diffused metal oxide semiconductor (LDMOS) transistor can include: (i) a field oxide layer structure adjacent to a drain region; and (ii) at least one drain oxide layer structure adjacent to the field oxide layer structure along a lateral direction, where a thickness of the drain oxide layer structure is less than a thickness of the field oxide layer, and at least one of a length of the field oxide layer structure and a length of the drain oxide layer structure is adjusted to improve a breakdown voltage performance of the LDMOS transistor.

Referring now to FIG. 1, shown is a cross-sectional view of a first example LDMOS transistor, in accordance with embodiments of the present invention. In this particular example, an n-type LDMOS is shown, and a "first" doping type is a p-type, and a "second" doping type is an n-type. The LDMOS transistor can include a base layer, p-type well region 105, n-type drift region 103, n-type source region 107, p-type body contact region 108, and n-type drain region 106. For example, p-type well region 105 may be located in the source region of the base layer, n-type drift region 103 can be located in the drain region of the base layer, n-type source region 107 and a p-type body contact region 108 may be located in p-type well region 105, and n-type drain region 106 may be located in n-type drift region 103. The LDMOS transistor can also include field oxide layer structure 104 located on an upper surface of the base layer and adjacent to the drain region, and at least one drain oxide layer structure 120 located on an upper surface of the base layer and adjacent to the field oxide layer structure in the lateral direction. For example, the thickness of drain oxide layer structure 120 may be less than the thickness of field oxide layer structure 104.

When the number of the drain oxide layer structures is greater than 1, the thickness of drain oxide layer structures 120 may gradually decrease along a direction from the drain region to a channel region of the LDMOS transistor. In this particular example, field oxide layer structure 104 and drain oxide layer structure 120 may be formed by a thermal oxidation process or a local oxidation of silicon (LOCOS) process. Drain oxide layer structure 120 can include drain oxide layer structures 1201 and 1202. Drain oxide layer structure 1201 may be adjacent to field oxide layer structure 104 and have a thickness that is less than that of field oxide layer structure 104. Drain oxide layer structure 1202 may be relatively close to the channel region and adjacent to drain oxide layer structure 1201. The thickness of drain oxide layer structure 1202 may be less than that of drain oxide layer structure 1201, such that drain oxide layer structure 120 is formed in a stepped structure, and its thickness gradually decreases along a direction from the drain region to the channel region. Drain region 106, source region 107, and body contact region 108 can be electrically connected to drain electrode Drain, source electrode Source, and body electrode Body, respectively (shown in FIG. 1 as connection terminals).

The LDMOS transistor can also include gate conductor 110 that fully covers the thinnest drain oxide layer structure and at least partially covers the drain oxide layer structure adjacent to the thinnest drain oxide layer structure. For example, gate conductor 110 may extend at least to the surface of drain oxide layer structure 1201. Gate conductor 110 can be electrically connected to the gate electrode Gate (shown in FIG. 1 as a connection terminal). The LDMOS transistor can also include gate dielectric layer 109 located under gate conductor 110, and adjacent to drain oxide layer structure 120. For example, gate dielectric layer 109 may be adjacent to drain oxide layer structure 1202. The breakdown voltage of the device can be increased by changing the length of the gate conductor on the oxide layer. Further, the longer the length of the gate conductor on the oxide layer extends toward the drain region direction, the higher the breakdown voltage of the device, where the oxide layer includes the drain oxide layer structure and the field oxide layer.

The base layer may include only p-type substrate 101, or the base layer may include p-type substrate 101 and n-type deep well region 102 located in substrate 101. In this particular example, p-type well region 105 and n-type drift region 103 may both be located in n-type deep well region 102. As compared to a single thick field oxide layer structure in an LDMOS transistor, this particular example may include at least one drain oxide layer structure adjacent to the field oxide layer, and the thickness of drain oxide layer structure may be thinner than that of the field oxide layer structure. Also, the thickness of the drain oxide layer structure may gradually decrease along a direction from the drain region to the channel region. The thinner oxide layer can alleviate the bird's beak effect of the device, and improve the hot carrier effect and reliability of the device. In addition, the thickest field oxide layer structure can withstand higher voltages, and the gradually decreasing thickness of drain oxide layer structure can make the distribution of the electric field more uniform, thereby improving the breakdown voltage performance of the device. The breakdown voltage performance of the LDMOS transistor may also be improved by adjusting the length ratio of the field oxide layer structure and the drain oxide layer structure.

When the length of drain oxide layer structure 120 is longer, or the thickness of drain oxide layer structure 120 is thinner, the hot carrier effect of the device may be improved, and the on-resistance (Rdson) of device is smaller, but the breakdown voltage (BV) of the transistor can also be decreased, and vice versa. The electric field of the device may be distributed more uniformly by adjusting the length ratio of each drain oxide layer structure. Therefore, the bird's beak effect may be alleviated mainly by adjusting the length ratio of the field oxide layer structure and the drain oxide layer structure in case the BV of the transistor reaches the requirements. In this way, the BV and Rdson of the transistor may have a better compromise given the trade-off, and the reliability of the hot carrier effect may be greatly improved. In this example, the drain oxide layer structure is a LOCOS, and those skilled in the art will recognize that a device structure having a drain oxide layer structure formed via shallow trench isolation (STI) or other suitable forms may also be utilized in certain embodiments.

Figure 2:
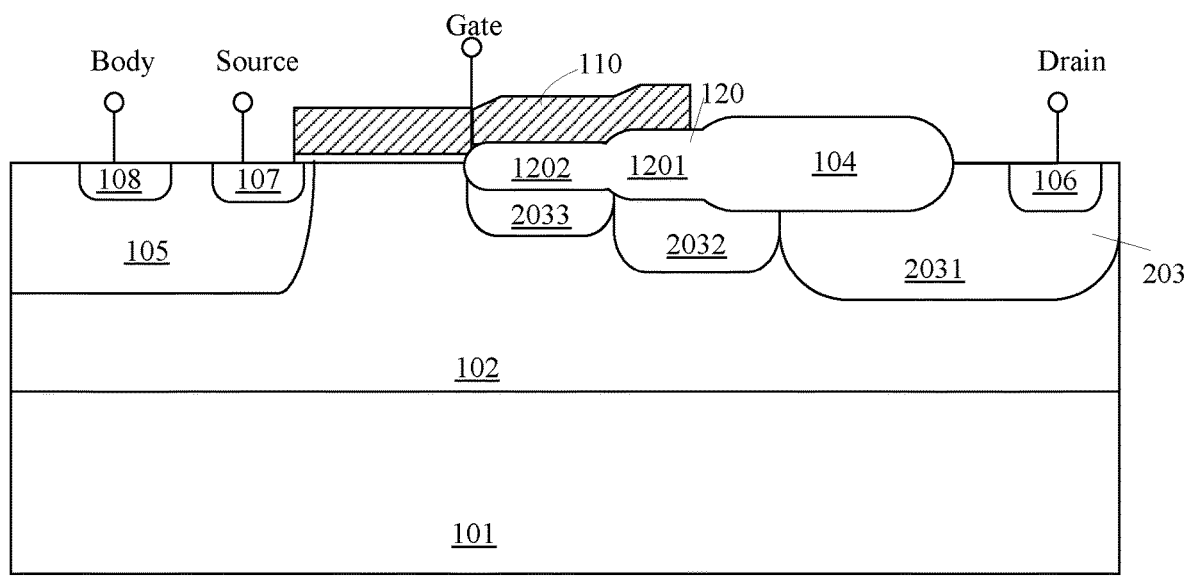
FIG. 2 is a cross-sectional view of a second example LDMOS transistor, in accordance with embodiments of the present invention.

Referring now to FIG. 2, shown is a cross-sectional view of a second example LDMOS transistor, in accordance with embodiments of the present invention. In this particular example, a junction depth of the drift region may decrease in the direction from the drain region to the channel region, and the doping concentration of the drift region may decrease in the direction from the drain region to the channel region, to improve the on-resistance performance of the LDMOS transistor. Drift region 203 can be formed by three regions of different junction depths and different doping concentrations. In the direction from the drain region to the channel region, the three regions are sequentially drift region 2031, drift region 2032, and drift region 2033. For example, the junction depth of drift region 2032 may be less than that of drift region 2031, and greater than that of drift region 2033. The doping concentration of drift region 2032 may be less than that of drift region 2031 and greater than that of drift region 2033.

In particular embodiments, the drift region with a gradually decreasing junction depth may be adopted to correspond to the drain oxide layer structure with gradually decreasing thickness. In this approach, the electric field distribution of the drain region is more uniform and no longer concentrated at a certain angle of the drift region. Thus, the breakdown voltage of the transistor may be further improved, the breakdown voltage and the on-resistance of the transistor have a better compromise given the trade-off, and the reliability of the transistor may be improved. In this example, drift region 203 may be formed by three regions. However, those skilled in the art will recognize that the number of drift regions may be reduced or increased according to the particular transistor requirements (e.g., 2 breakdown voltage, on-resistance, etc.), such that the breakdown voltage and the on-resistance of the transistor have a better compromise or balance.

Figure 3:
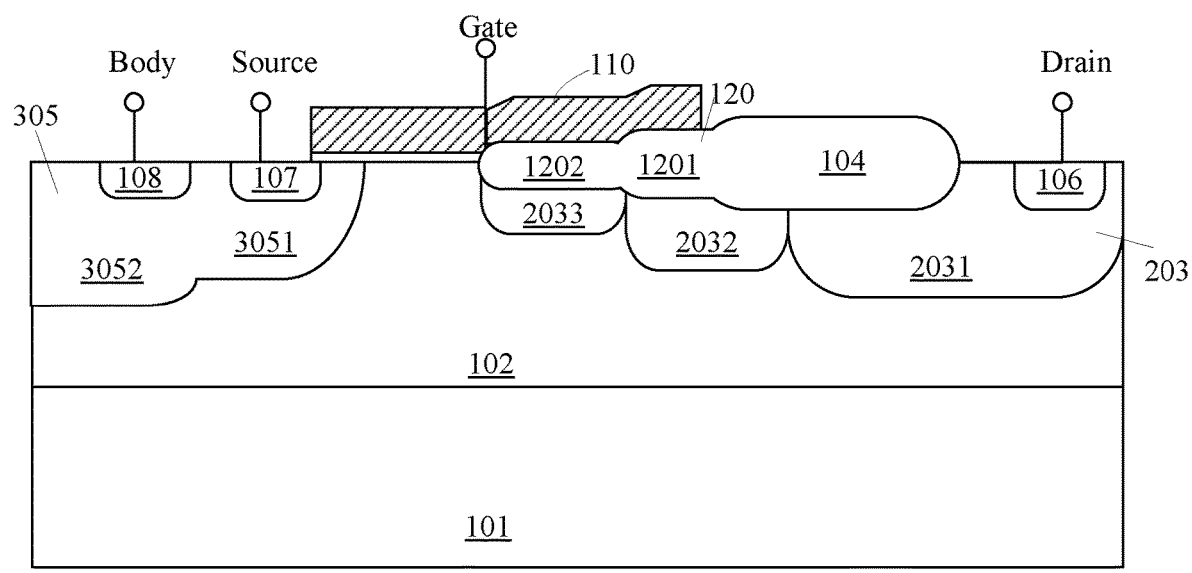
FIG. 3 is a cross-sectional view of a third example LDMOS transistor, in accordance with embodiments of the present invention.

Referring now to FIG. 3, shown is a cross-sectional view of a third example LDMOS transistor, in accordance with embodiments of the present invention. In this particular example, the p-type well region is a composite well region. For example, the composite well region closer to drain region may have a first convex region in the lateral direction, and the composite well region toward the bottom of the base layer may have a second convex region in the vertical direction. Composite well region 305 may be formed by superposing well regions 3052 and 3051. For example, a width of well region 3051 may be greater than a width of well region 3052, a junction depth of well region 3052 may be greater than that of well region 3051, and a doping concentration of well region 3052 may be less than a doping concentration of well region 3051. Well region 3051 can be used to adjust a threshold voltage of the transistor. The width of well region 3052 may be less than the width of well region 3051 to form a channel region on the surface of the base layer. The doping concentration of well region 3052 may be less than or equal to the doping concentration of well region 3051 in order to reduce its effect on the threshold voltage. Well region 3052 may utilize its depth to increase the area through which the channel current flows to increase the bulk resistance the transistor. In this way the safe operating region of the device, and the breakdown voltage of the transistor, may be increased.

Figure 4A:
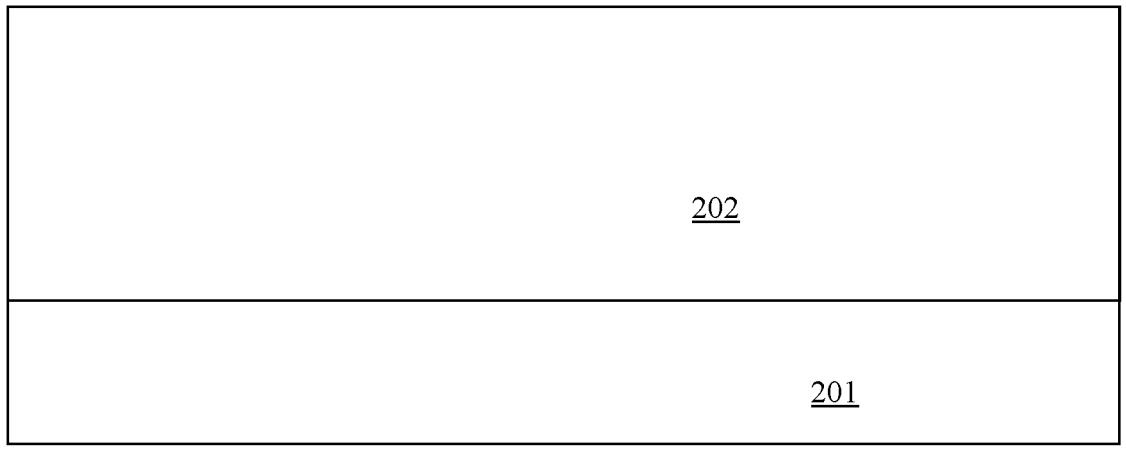
FIG. 4A-4J are cross-sectional views showing stages of manufacturing the third example LDMOS transistor, in accordance with embodiments of the present invention.
Figure 4B:
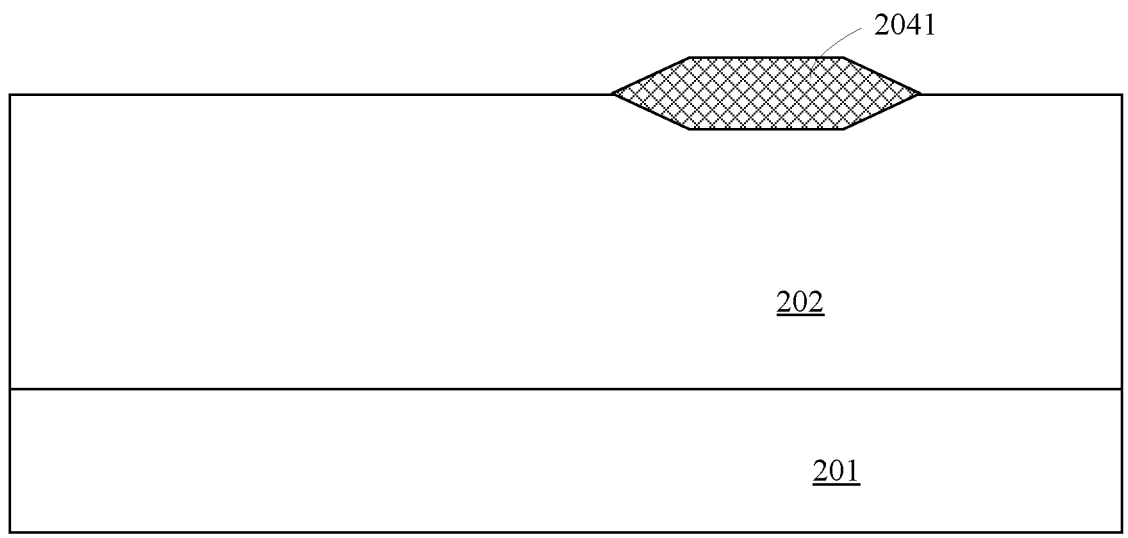
Figure 4C:
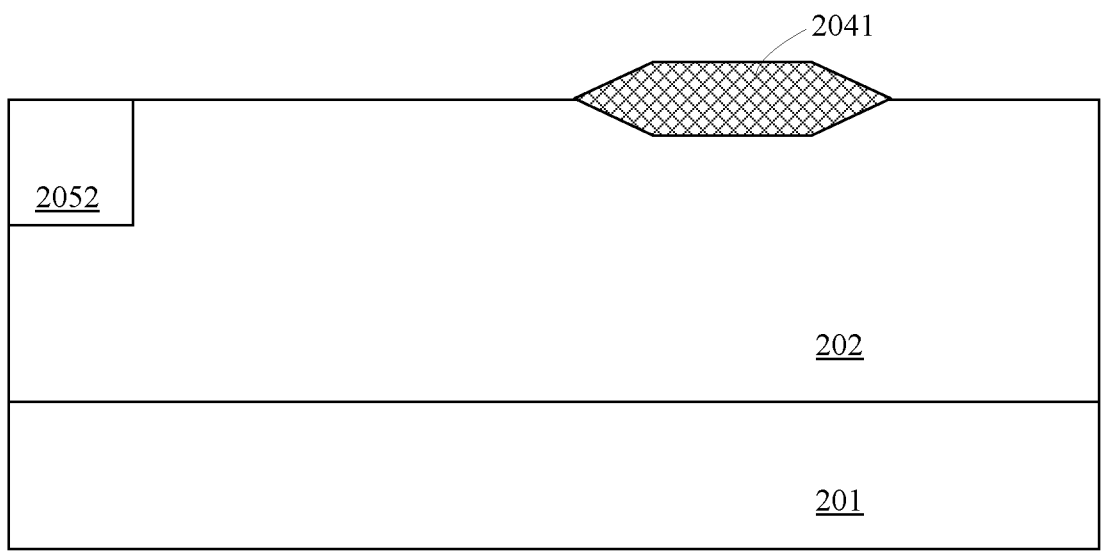
Figure 4D:
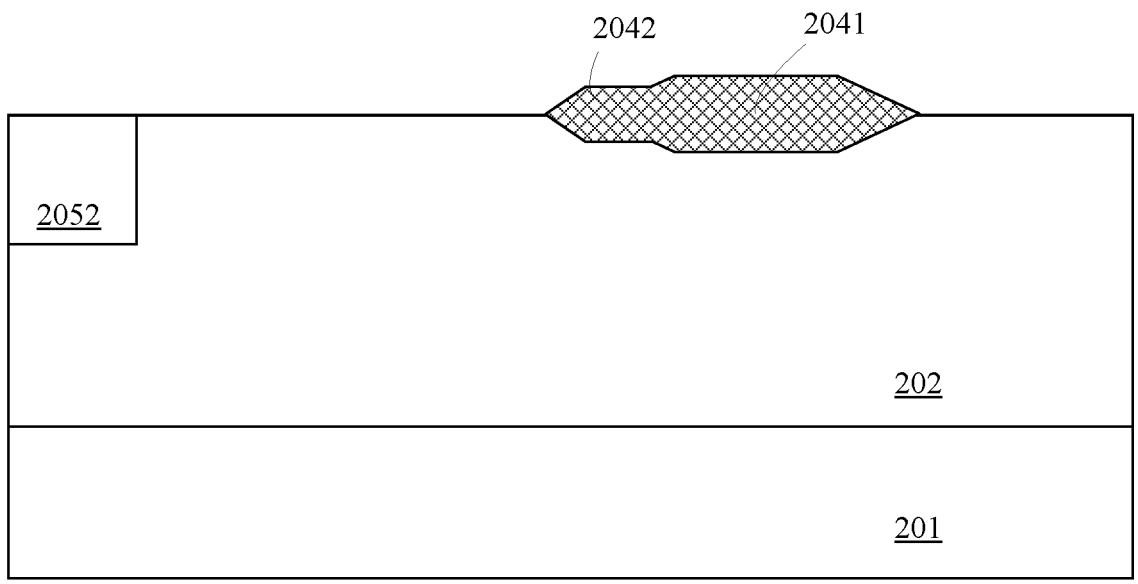
Figure 4E:
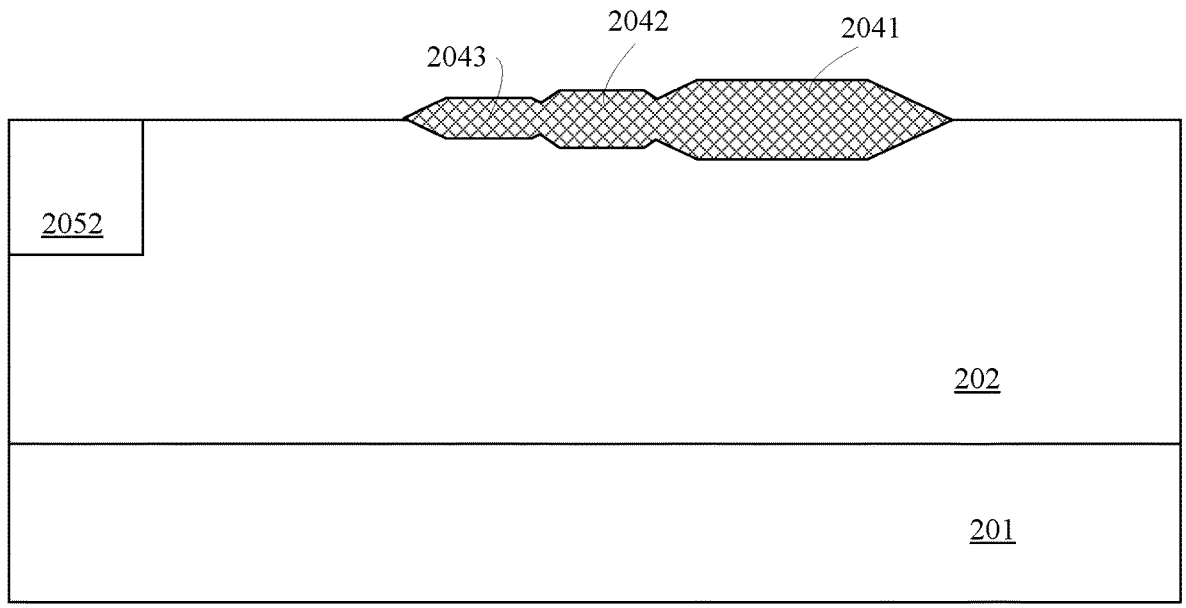

Referring now to FIG. 4A-4J, shown are cross-sectional views showing stages of manufacturing the third example LDMOS transistor, in accordance with embodiments of the present invention. In this particular example, a field oxide layer structure can be formed adjacent to a drain region on an upper surface of a base layer. In addition, at least one drain oxide layer structure can be formed adjacent to the field oxide layer structure on the upper surface of the base layer along the lateral direction, where the thickness of the drain oxide layer structure is less than the thickness of the field oxide layer. In FIG. 4A, p-type substrate 201 may be provided, and deep well region 202 can be formed by implanting an n-type impurity into substrate 201.

Subsequently, as shown in FIGS. 4B-4E, field oxide layer structure 2041 and drain oxide layer structure can be sequentially grown along a direction from the drain region to the channel region on the surface of the drain region of deep well region 202 by a thermal oxidation process or LOCOS process. In particular embodiments, the number of the drain oxide layer structures is two: drain oxide layer structures 2042 and 2043. Further, a thickness of field oxide layer structure 2041, a thickness of drain oxide layer structure 2042, and a thickness of drain oxide layer structure 2043 may be sequentially decreased by controlling temperature, time, pressure, and other parameters of the thermal oxidation process. Further, between forming field oxide layer structure 2041 and forming drain oxide layer structure 2042, a p-type impurity may be implanted in a source region of the LDMOS transistor to form well region 2052. For example, the breakdown voltage performance of the LDMOS transistor can be improved by adjusting the length ratio of the field oxide layer structure and the drain oxide layer structure. Subsequently, an n-type drift region may be formed in the drain region of the base layer. For example, a junction depth of the drift region may gradually decrease in the direction from the drain region to the channel region, in order to increase the on-resistance performance of the LDMOS transistor.

Figure 4F:
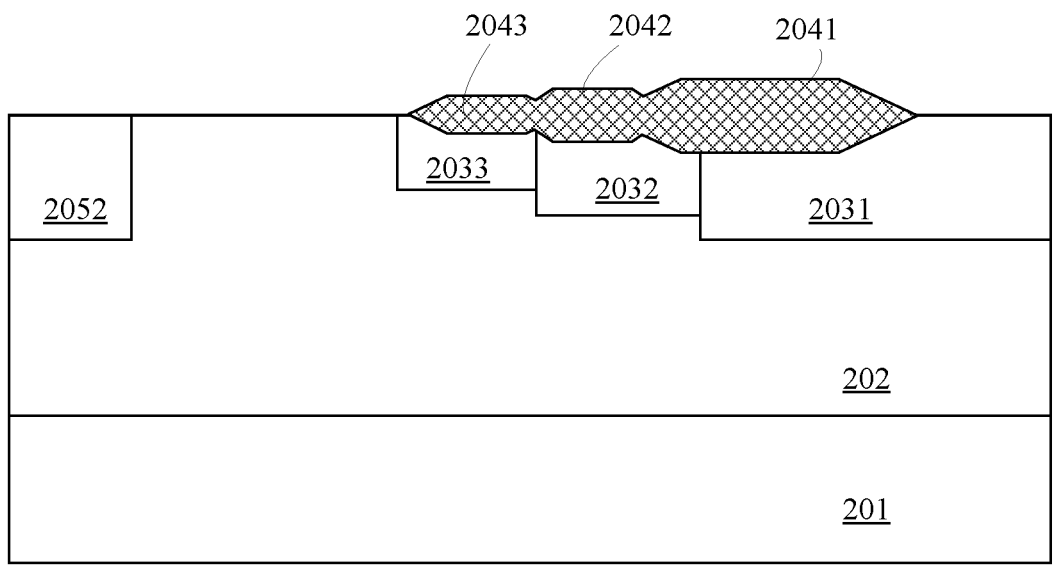

In FIG. 4F, drift regions 2031, 2032, and 2033 may sequentially be formed along the direction from the drain region to the channel region, such as by an ion implantation process. A doping concentration of drift region 2031, a doping concentration of drift region 2032, and a doping concentration of drift region 2033 may sequentially decrease. Also, a junction depth of drift region 2031, a junction depth of drift region 2032, and a junction depth of drift region 2033 may also be sequentially decreased by controlling the energy of the ion implantation.

Figure 4G:
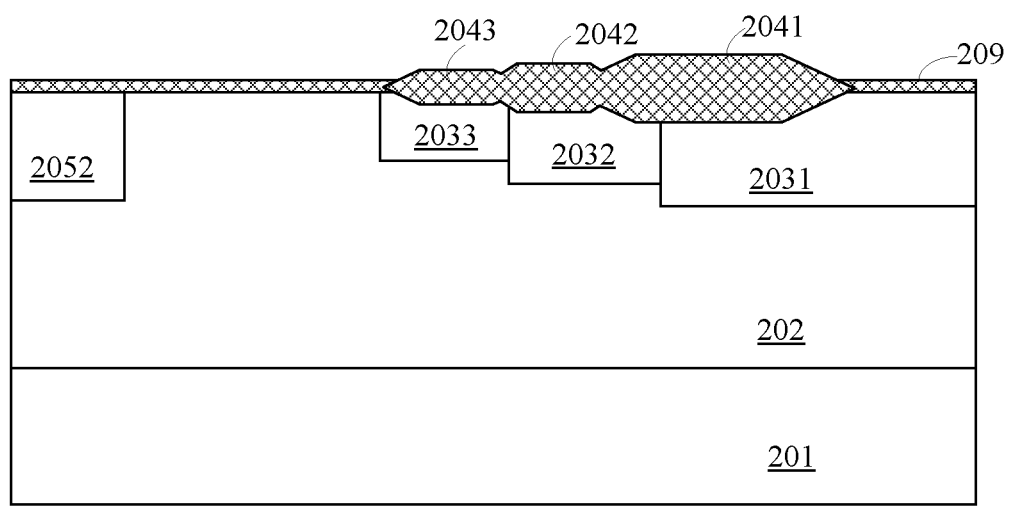
Figure 4H:
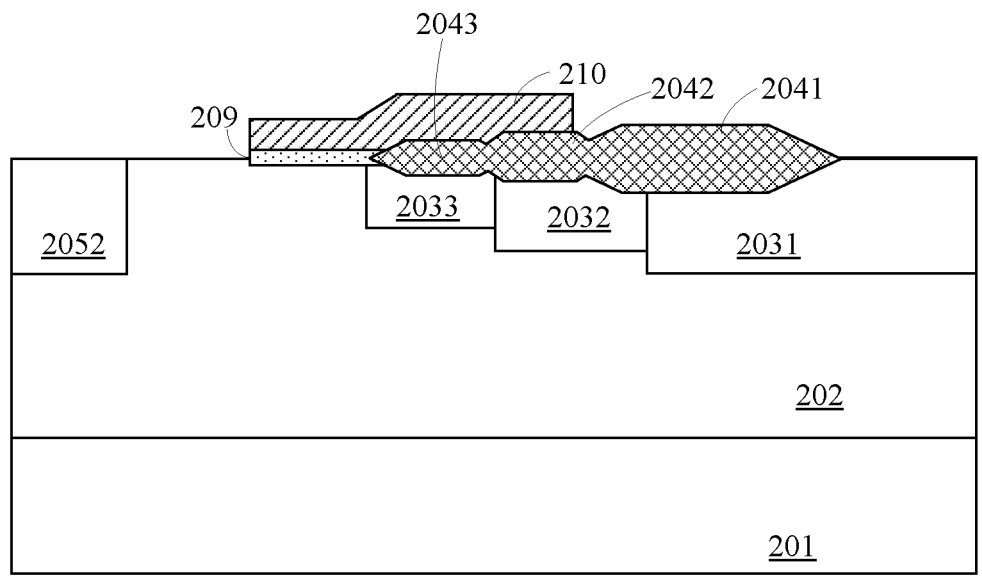

In FIGS. 4G-4H, an oxide layer may be formed by a thermal oxidation process in regions where the surface of deep well region 202 is not covered by the field oxide layer structure and the drain oxide layer structure. In addition, the oxide layer may be partially etched to form gate dielectric layer 209. In FIG. 4H, gate conductor 210 can be formed on dielectric layer 209 and a portion of the drain oxide layer structure. For example, along the lateral direction, the gate conductor may fully cover the thinnest drain oxide layer structure, and at least partially cover the drain oxide layer structure adjacent to the thinnest drain oxide layer structure. For example, gate conductor 210 can extend at least to the surface of drain oxide layer structure 2042.

Figure 4I:
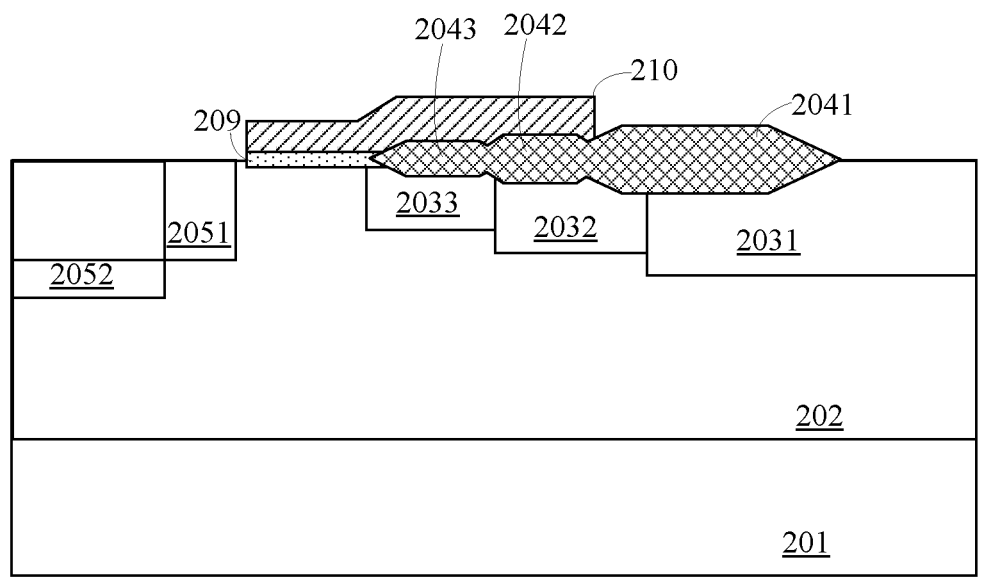
Figure 4J:
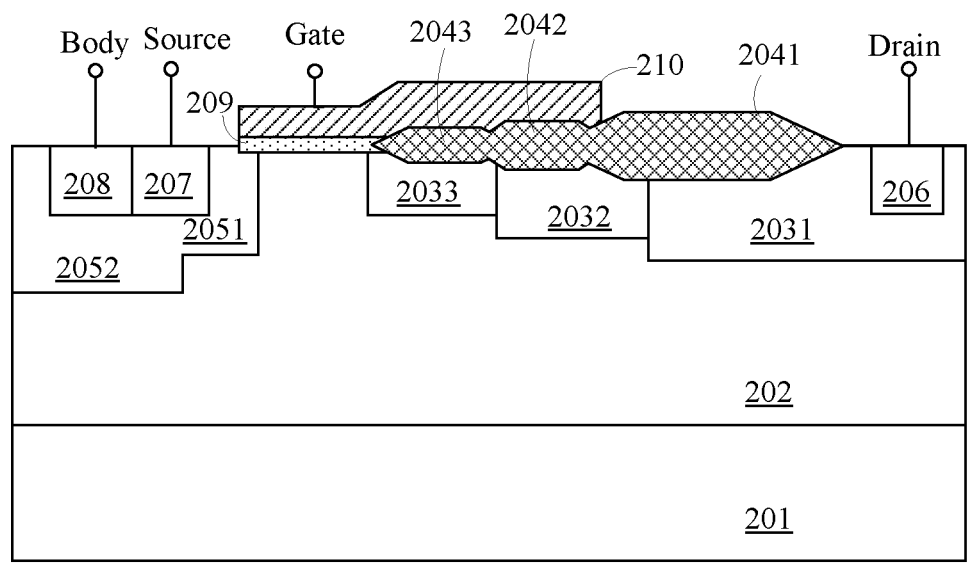

In FIG. 4I, p-type impurity may be implanted in the source region to form well region 2051 such that well region 2051 partially overlaps with well region 2052. For example, a width of well region 2051 may be greater than that of well region 2052, and a junction depth of well region 2052 may be greater than that of well region 2051. Also, well regions 2051 and 2052 may be superposed to form a composite well region. The composite well region closer to the drain region may have a first convex region along the lateral direction, and the composite well region toward the bottom of the base layer may have a second convex region along the vertical direction. Finally, as shown in FIG. 4J, drain region 206 can be formed in the drift region, and source region 207 and body contact region 208 may be formed in the composite well region.

In particular embodiments, an LDMOS transistor can include a field oxide layer structure adjacent to a drain region, and at least one drain oxide layer structure adjacent to the field oxide layer structure along a lateral direction. A thickness of the drain oxide layer structure may be less than that of the field oxide layer. When the number of the drain oxide layer structures is greater than 1, the thickness of the drain oxide layer structure can gradually decrease along a direction from a drain region to a channel region of the LDMOS transistor. The LDMOS transistor may also include a drift region of a second doping type located in the drain region, and a composite well region located in a source region of the LDMOS transistor. In addition, a junction depth of the drift region may gradually decrease along a direction from the drain region to the channel region of the LDMOS transistor. In particular embodiments, the drain oxide layer structure with gradually decreasing thickness can relieve the bird's beak effect, improve the hot carrier effect, and improve the reliability and breakdown voltage of the transistor. Also, the drift region with decreasing junction depth can achieve a better compromise/balance between the breakdown voltage and the on-resistance, and the safe operating region of the transistor may accordingly be improved.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A laterally diffused metal oxide semiconductor (LDMOS) transistor, comprising:
   a) a field oxide layer structure adjacent to a drain electrode region on an upper surface of a base layer;
   b) at least one drain oxide layer structure adjacent to the field oxide layer structure only along a lateral direction on the upper surface of the base layer, wherein each of the at least one drain oxide layer structure and the field oxide layer structure comprises an oxide; and
   c) wherein a thickness of the drain oxide layer structure is less than a thickness of the field oxide layer, and adjustments of at least one of a length of the field oxide layer structure and a length of the drain oxide layer structure change a breakdown voltage performance of the LDMOS transistor.

2. The LDMOS transistor according to claim 1, further comprising a drift region located in a drain region and having a second doping type, wherein the drain oxide layer and the field oxide layer are located in the drift region.

3. The LDMOS transistor according to claim 1, further comprising a composite well region located in a source region and having a first doping type, wherein the composite well region close to the drain electrode region comprises a first convex region in the lateral direction, and the composite well region toward the bottom of the base layer comprises a second convex region in a vertical direction.

4. The LDMOS transistor according to claim 2, wherein a doping concentration of the drift region gradually decreases along the direction from the drain region to the channel region.

5. The LDMOS transistor according to claim 3, wherein the composite well region is formed by superposing a first well region and a second well region, a width of the second well region is greater than a width of the first well region, and a junction depth of the first well region is greater than a junction depth of the second well region.

6. The LDMOS transistor according to claim 5, wherein a doping concentration of the first well region is less than a doping concentration of the second well region.

7. The LDMOS transistor according to claim 1, wherein when the number of the drain oxide layer structures is greater than 1, the thickness of the drain oxide layer structures gradually decreases along the direction from the drain region to the channel region.

8. The LDMOS transistor according to claim 7, further comprising a gate conductor that fully covers the thinnest drain oxide layer structure and at least partially covers the drain oxide layer structure adjacent to the thinnest drain oxide layer structure.

9. The LDMOS transistor according to claim 8, further comprising a gate dielectric layer located under the gate conductor and adjacent to the drain oxide layer structure.

10. The LDMOS transistor according to claim 1, further comprising a source electrode region having a second doping type and a body contact region having a first doping type located in a well region of a source region, wherein the drain electrode region has a second doping type and is located in the drift region.

11. The LDMOS transistor according to claim 1, wherein the length ratio of the field oxide layer structure to the drain oxide layer structure is adjusted to change the breakdown voltage performance of the LDMOS transistor and an on-resistance performance.

12. The LDMOS transistor according to claim 7, wherein the length ratio of each drain oxide layer structure is adjusted to change the breakdown voltage performance of the LDMOS transistor.

13. The LDMOS transistor according to claim 2, wherein a junction depth of the drift region gradually decreases in a direction from the drain region to a channel region.

14. The LDMOS transistor according to claim 1, wherein each of the at least one drain oxide layer structure and the field oxide layer structure is formed by an oxidation process.

15. The LDMOS transistor according to claim 1, wherein each of the at least one drain oxide layer structure and the field oxide layer structure is centered about the upper surface of the base layer.

* * * * *